United States Patent
Yasuoka

(10) Patent No.: US 6,338,879 B1
(45) Date of Patent: Jan. 15, 2002

(54) SOLID LUBRICANT FILM FOR COATED CUTTING TOOL AND METHOD FOR MANUFACTURING SAME

(75) Inventor: Manabu Yasuoka, Toyama (JP)

(73) Assignee: Nachi-Fujikoshi Corp., Toyama-city (JP)

( * ) Notice: Subject to any disclaimer, the term of this patent is extended or adjusted under 35 U.S.C. 154(b) by 0 days.

(21) Appl. No.: 09/457,400

(22) Filed: Dec. 9, 1999

(30) Foreign Application Priority Data

Dec. 9, 1998 (JP) ............................................. 10-349889

(51) Int. Cl.[7] .......................... C23C 14/08; C23C 16/40
(52) U.S. Cl. ........................ 427/529; 427/530; 427/528; 427/531; 427/255.31; 427/255.391; 427/255.394
(58) Field of Search .................................. 427/529, 523, 427/528, 530, 531, 255.31, 255.391, 255.394

(56) References Cited

U.S. PATENT DOCUMENTS

| | | | | |
|---|---|---|---|---|
| 3,915,757 A | * | 10/1975 | Engel | 427/531 |
| 4,441,894 A | * | 4/1984 | Sarin et al. | 427/249.17 |
| 4,507,189 A | * | 3/1985 | Doi et al. | 427/523 |
| 4,634,600 A | * | 1/1987 | Shimizu et al. | 427/528 |
| 4,826,365 A | * | 5/1989 | White | 408/144 |
| 5,858,181 A | * | 1/1999 | Jindal et al. | 427/523 |

FOREIGN PATENT DOCUMENTS

JP 9-192908 7/1997

* cited by examiner

*Primary Examiner*—Bret Chen
(74) *Attorney, Agent, or Firm*—Venable; Robert Kinberg

(57) ABSTRACT

A method for manufacturing a solid lubricant film for cutting tools, having a hard material layer positioned on a tool steels, high-speed steels or cemented carbide substrate, includes the steps of: depositing on the hard material layer a solid lubricant oxide layer ($MO_x$ : $0.2 \leq x < 2$) where the metal M is selected from Si, Zr, Ni, Fe, Co, Cr or combinations thereof. The thickness (t) of the solid lubricant oxide layer is $0.01 \mu m \leq t < 3.0 \mu m$. The solid lubricant oxide film is deposited on the harden layer by heating a vacuum ion-plating chamber to a temperature of between from 150° C. to 450° C., and depositing on the coated cutting tool the solid lubricant oxide layer by an ion-plating. A negative bias charge is applied using a direct current of from −15 V to −1000 V or a high frequency alternating current equivalent to an effective negative bias charge of the direct current of from −15 V to −1000 V.

4 Claims, 6 Drawing Sheets

×100

×100

DECISION A: GOOD

DECISION B: BAD

SOLID LUBRICANT FILM FOR COATED CUTTING TOOL AND METHOD FOR MANUFACTURING SAME

BACKGROUND OF THE INVENTION

1. Field of the Invention

The present invention relates to a method for manufacturing a solid lubricant film for a coated cutting tool including a drill, an end mill or a tap, having a substrate made of a tool steel, a high-speed steel, a cemented carbide, a cermet or a ceramic and being coated with a hard material including any one of TiN, TiCN, or TiAlN, or combinations thereof to improve a lubricant property of the cutting tool.

2. Description of the Related Art

Conventionally, a physical vapor deposition technique including an ion-plating is commonly used as a method for manufacturing a coated cutting tool. The main purpose thereof is to deposit on the cutting tool a coated film of a hard material including TiN, TiCN, TiAlN, and CrN. On the other hand, to improve a lubricant property of the cutting tool, a Japanese patent publication No. 09192908 published on Jul. 29, 1997, for example, discloses a dry lubricant coating film consisting mainly of molybdenum disulfide and fluorocarbon as main components, or that of consisting of graphite. These dry lubricant coating films are utilized by depositing or by wet-plating technique of lubricant powder, or by mold pressing, on portions of rotating parts.

A widespread of coated cutting tools in recent years resulted an improvement in manufacturing efficiencies as well as reductions of machining costs in metal cutting fields. These are achieved from the fact that coated materials are hard metals improving a wear resistance of the coated cutting tool.

On the other hand, the dry lubricant coating film consisting mainly of molybdenum disulfide and fluorocarbon as disclosed in the above publication No. 09192908, when applied to the cutting tool, will soon be removed from the surfaces of the cutting tool during machining work. To keep a long lubricant effect on the cutting tool, these dry lubricant coating film must be applied every time the cutting tool is used.

SUMMARY OF THE INVENTION

An object of this invention is to provide a solid lubricant film which has a very low frictional coefficient and improves a lubricant property of a coated cutting tool and a method for manufacturing the same for the coated cutting tool including a drill, an end mill or a tap, having a substrate made of a tool steel, a high-speed steel, or a cemented carbide, a cermet or a ceramic and being coated with a hard material film including any one of TiN, TiCN, or TiAlN, or combinations thereof.

Another object of this invention is to provide a solid lubricant film and a method for manufacturing the same for a coated cutting tool which has a long service life that stay sharp.

These and other objects are achieved by such a solid lubricant film and such a method for manufacturing the same for a coated cutting tool including a drill, an end mill or a tap, having a substrate made of a tool steel, a high-speed steel, a cemented carbide, a cermet or a ceramic and being coated with a hard material including any one of TiN, TiCN, or TiAlN, or combinations thereof. The method for manufacturing the solid lubricant film comprises: depositing on the coated cutting tool a solid lubricant oxide film ($MO_x$: $0.2 \leq x < 2$) including an Oxygen as a main ingredient and metal M consisting of any one of Si, Zr, Ni, Fe, Co and Cr or combinations thereof; the thickness (t) of the solid lubricant oxide film being $0.01 \ \mu m \leq t < 2.0 \ \mu m$. The solid lubricant oxide film is deposited on the coated cutting tool under conditions; heating a vacuum ion-plating chamber from room temperature to a temperature of between from 150° C. to 450° C.; and depositing the solid lubricant oxide film by an ion-plating by applying a negative bias voltage charge of a direct current of from −15 V to −1000 V or by applying a high frequency alternating current having an effective negative bias voltage charge equivalent to those of the direct current of from −15 V to −1000 V.

By such arrangements, by forming such metal oxide coating film on the coated cutting tool, the appropriate solid lubricant film has a very low frictional coefficient and improves a lubricant property of the coated cutting tool, and further, it greatly lengthens the service life that stay sharp of the coated cutting tool. Since such metal oxide coating film has the very low frictional coefficient, it greatly improves its lubricating property as compared with the above described conventional dry lubricant coating film consisting of molybdenum disulfide and fluorocarbon. However, if a metal oxide coating film has a too little frictional coefficient, it is prone to induce a chipping or a breakage of the chip of the coated cutting tool. Therefore, there are no saying that "the lower the frictional coefficient, the better metal oxide coating film".

More specifically, generally speaking, although a coated cutting tool has a property to reduce a frictional coefficient thereof as compared with an uncoated cutting tool, in order to enhance an anti-condensability of the work material, it is appropriate to form a metal oxide film on the coated cutting tool. However, since most metal oxide form a dielectric insulator and commonly deposited via a chemical vapor deposition (CVD) technique, and further, to enhance its lubricant property of the coated cutting tool, it is generally formed rather thicker, resulting to be not appropriate as a cutting edge of a cutting tool. In case a metal oxide film is formed using conventional CVD technique generally formed in a high temperature, it is hard to repeat coating application on the metal oxide film. Since such metal oxide film has a good metallurgical bond with the base coating film, the metal oxide film is prone to cause to be removed together with the base coating film of the cutting tool as a whole, or only the upper lubricant metal oxide film is removed. Therefore, to coat the upper lubricant metal oxide film, it is essential to control its coating process.

To enhance a lubricant property of the lubricant oxide film for the coated cutting tool of this invention, the appropriate lubricant oxide film and the method for manufacturing the same is specified as using the ion-plating under conditions as set forth in claim 1. The reason the claim 1 specifically restricted the process data will be given below.

Wherein, the ion-plating under the temperature of the vacuum ion-plating chamber less than 150° C. results that the deposited lubricant oxide film has a poor adhesion with the coated cutting tool, on the other hand, in case that temperature exceeds 450° C., the deposited lubricant oxide film becomes friable, therefore the temperature of the vacuum ion-plating chamber is limited to range between from 150° C. to 450° C. The ion-plating by applying a negative bias voltage charge of a direct current less than −15 V does perform an insufficient reaction with the Oxygen and do not generate a good lubricant oxide film, on the other hand, in case that negative bias voltage charge exceeds or lower than −1000 V, via an ion bombardment effect usually introduced in the ion-plating process, the reaction with the Oxygen becomes excessive or do not generate a lubricant oxide film, therefore, the negative bias voltage charge applying in the ion-plating is limited to range from −15 V to or a high frequency alternating current having an effective negative bias voltage charge equivalent to those of the direct current of from −15 V to −1000 V. And the thickness (t) of the solid lubricant oxide film less than 0.01 $\mu$m does not perform a purported effect, and that of over 2.0 $\mu$m is liable to cause a chipping or pealing of the lubricant oxide film, the thickness (t) is limited to range 0.01 $\mu$m<t<2.0 $\mu$m.

Preferably, the solid lubricant oxide film similarly enhances the lubricant property may be plated through the wet plating technique including a thermal oxidization, an anode oxidization or a steam-treatment technique as set forth in claim 2, wherein, since the thickness (t) of such solid lubricant oxide film less than 0.01 $\mu$m does not perform a purported effect, and that of over 3.0 $\mu$m is liable to cause a chipping or peeling of the lubricant oxide film, the thickness (t) of the solid lubricant oxide film via a steam-treatment technique is limited to range 0.01 $\mu$m≦t<3.0 $\mu$m.

Any one of the solid lubricant oxide films plated according to the present invention has a high adhesion with its base hard material coating film of the coated cutting tool as been shown in FIG. 1(a). Wherein in an indentation generated by an impression of an A-scale Rockwell hardness tester on the solid lubricant oxide film being observed in an optical sight of a microscope of one hundred magnifications no peeling or no obvious cracking between the substrate and the solid lubricant oxide film or between the substrate and the base or lower hard material film in an area extending over 1 mm from the periphery of the indentation. Claim 3 limits such criterion of judging grade of the adhesion with its base or lower hard material coating film. As compared with those of plated according to the conventional coating method shown in FIG. 1(b), it has a low adhesion with its base hard material coating film. In order to have a high adhesion with its base coating film, it is effective to coat a solid lubricant oxide film of the present invention which has the same or lesser hardness than that of the base hard material coating film.

FIGS. 2(a) and 2(b) illustrate enlarged partial sectional views of solid lubricant oxide films of the present invention in which it will be observed that a lubricant property of the upper solid lubricant oxide film according to the present invention is effected through a high bondability between a rough or defective porous surface of the base or lower hard material film and residual oxides of the solid lubricant oxide film thereon.

DETAILED DESCRIPTION OF THE PREFERRED EMBODIMENTS

EXAMPLE 1

A first comparative cutting tests of boring of through holes under dry cutting or without using coolant oil are conducted as an Example 1 wherein each two pieces of uncoated high speed tool steel SKH51 $\phi$ 6 mm drills, TiAlN coated SKH51 $\phi$ 6 mm drills, inventive TiAlN+NiO$_x$ coated SKH51 $\phi$ 6 mm drills and inventive TiAlN+ZrO$_x$ coated SKH51 $\phi$6 mm drills, are tested, each base coating film or each upper lubricant oxide coating films is deposited via an ion-plating, and the cutting tests are conducted under the following conditions:

Cutting condition; Dry cutting
Cutting speed; 20.7 m/min
Feed rate; 0.12 mm/rev
Works; made of SNC 836 280HB
Thickness; 20 mm through hole
Ion-plating process;
Inventive NiO$_x$ coating of the TiAlN +NiO$_x$ coating;
  (a) forming a preliminary vacuum in an ion-plating chamber from room temperature to a pressure of below 2.67×10$^{-3}$ Pa so as to eliminate the air,
  (b) heating the chamber from a room temperature to a temperature up to 300° C.,
  (C) introducing an ion bombardment for about 10 minutes in the chamber via applying a bias negative direct current of −200 V, and
  (d) while melting Ni in a crucible in the chamber as an evaporation source and introducing an Oxygen gas in the chamber at a pressure of 2.67 ×10$_{-2}$ Pa, ion-plating with Ni O$_x$ on the TiAlN coated work for about 20 minutes in the chamber. Inventive NiO$_x$ coating of the TiAlN+ZrO$_x$ coating; repeat (a)~(c);

(e) while melting Zr in a crucible in the chamber as an evaporation source and introducing an Oxygen gas in the chamber at a pressure of 2.67 ×10$^{-2}$ Pa, ion-plating with ZrO$_x$ on the TiAlN coated work for about 20 minutes in the chamber.

Figure 3:
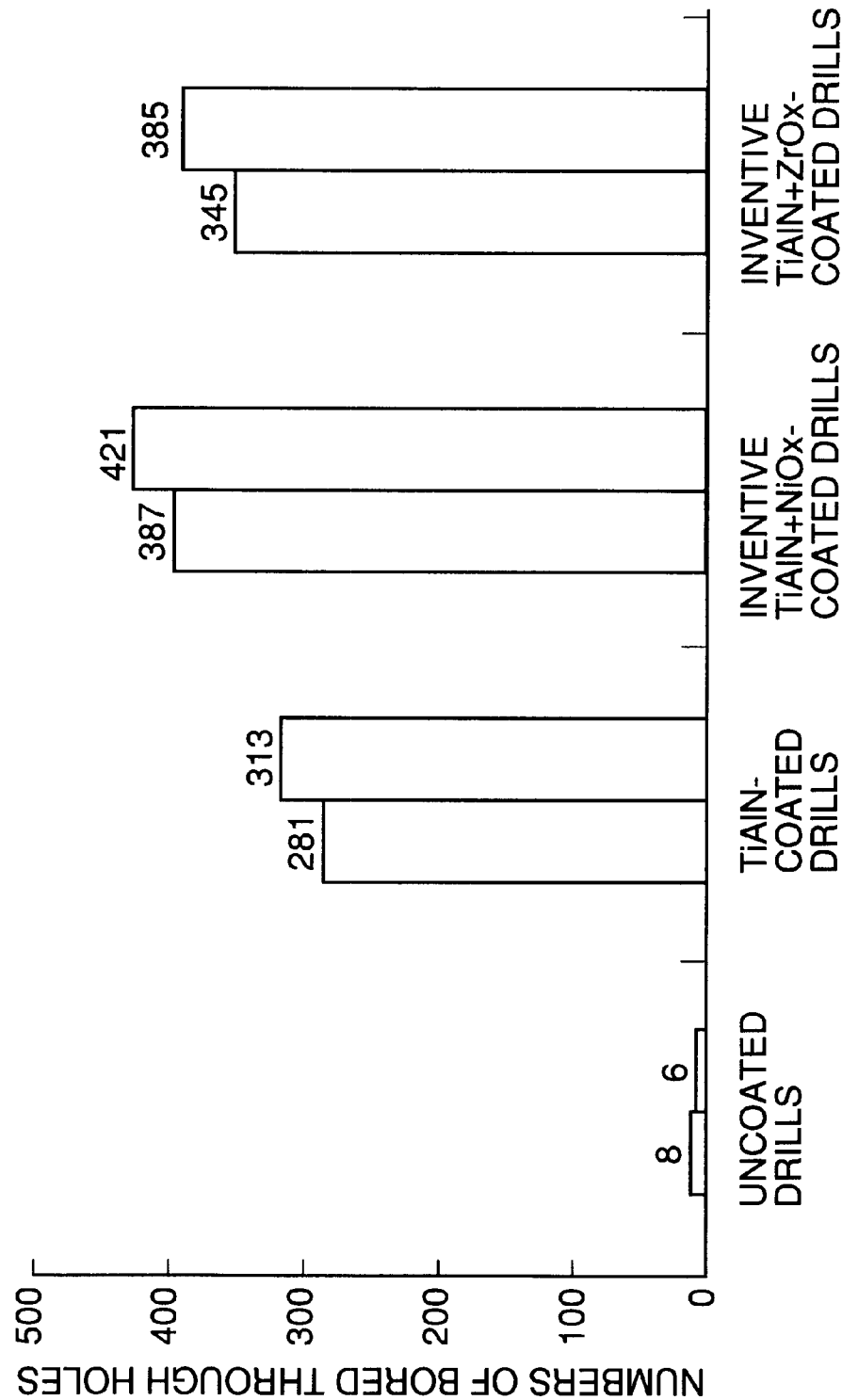
FIG. 3 is a graph illustrating the test results performed in the Example 1 wherein each two pieces of uncoated high speed tool steel SKH51 $\phi$ 6 mm drills, TiAlN coated SKS51 $\phi$ 6 mm drills, inventive TiAlN +NiO$_x$ coated SKH51$\phi$ 6 mm drills and inventive TiAlN+ZrO$_x$ coated SKH51 $\phi$ 6 mm drills, are tested, each coating is deposited via an ion-plating technique.

The test results are shown in FIG. 3. From the FIG. 3, it will be apparent that the numbers of through holes bored by the inventive NiO$_x$ or ZrO$_x$ coated drills exhibited far better service lives lengthened by over 25% than those of the conventional TiAlN coated drills.

EXAMPLE 2

A second comparative cutting tests of boring of through holes without using coolant oil are conducted as an Example 2 wherein each two pieces of uncoated cemented carbide φ 6 mm drills, TiCN coated cemented carbide φ 6 mm drills, inventive TiCN+FeO$_x$ coated cemented carbide φ6 mm drills and inventive TiAlN+NiO$_x$ coated cemented carbide φ 6 mm drills, are tested, each base coating film or each upper lubricant oxide coating films is deposited via the ion-plating technique, and the cutting tests are conducted under the following conditions:

Cutting condition; Dry cutting P30
Cutting speed; 30.0 m/min
Feed rate; 0.12 mm/rev
Works; made of S 50 C 180HB
Thickness; 18 mm through hole
Ion-plating process;
Inventive FeO$_x$ coating of TiCN+FeO$_x$ coating;
  (a) forming a preliminary vacuum in an ion-plating chamber to a pressure of below 2.67×10$^{-3}$ Pa so as to eliminate the air,
  (b) heating the chamber from room temperature to a temperature up to 300 C,
  (C) introducing an ion bombardment for about 10 minutes in the chamber via applying a bias negative direct current of −750 V, and
  (d) while melting Fe in a crucible in the chamber as an evaporation source and introducing an Oxygen gas in the chamber at a pressure of 2.67 ×10$^{-2}$Pa, ion-plating with Fe O$_x$ on the TiCN coated minutes in the chamber. Inventive NiO$_x$ coating of TiAlN+NiO$_x$ coating; repeat (a)-(C);
  (e) while melting Ni in a crucible in the chamber as an evaporation source and introducing an Oxygen gas in the chamber at a pressure of 2.67 ×10$^{-2}$Pa, ion-plating with Ni O$_x$ on the TiCN coated work for about 15 minutes in the chamber.

Figure 4:
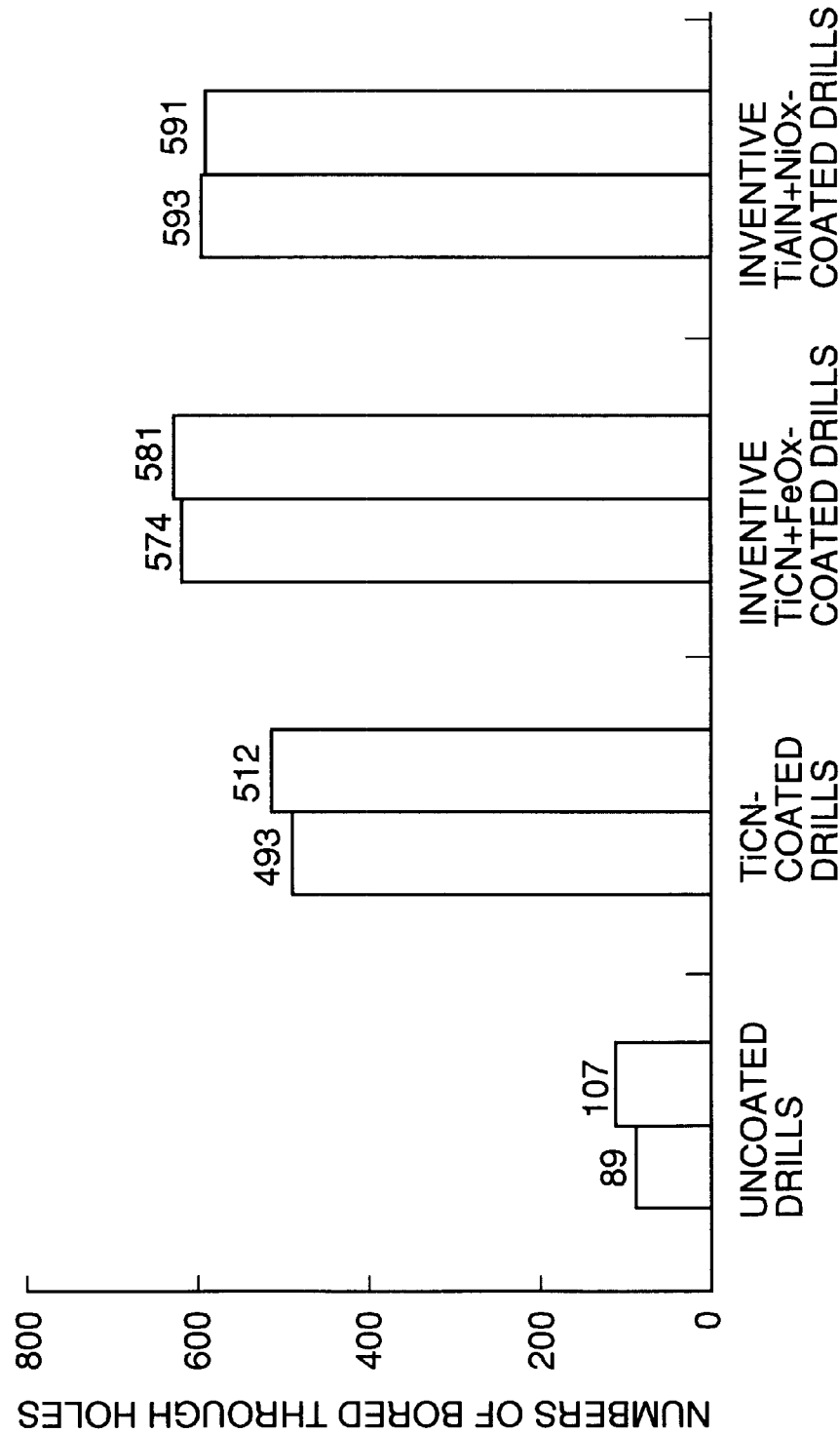
FIG. 4 is a graph illustrating the test results performed in the Example 2 wherein each two pieces of uncoated cemented carbide $\phi$ 6 mm drills, TiCN coated cemented carbide$\phi$ 6 mm drills, inventive TiCN+FeO$_x$ coated cemented carbide $\phi$ 6 mm drills and inventive TiAlN+NiO$_x$ coated cemented carbide $\phi$ 6 mm drills, are tested, each coating is deposited via the ion-plating technique.

The test results are shown in FIG. 4. From the FIG. 4, it will be apparent that the numbers of through holes bored by the inventive FeO$_x$ or NiO$_x$ coated drills exhibited far better service lives lengthened by over 20% than those of the conventional TiCN coated drills.

EXAMPLE 3

A third comparative cutting tests of boring of through holes without using coolant oil are conducted as an Example 3 wherein each two pieces of uncoated high speed tool steel SKH51 φ 6 mm drills, TiAlN coated SKH51 φ 6 mm drills, inventive TiCN+NiO$_x$ coated SKH51 φ 6 mm drills and inventive TiAlN+NiO$_x$ coated SKH51 φ 6 mm drills, are tested, wherein each TICN or TiAlN coating is plated via the ion-plating technique, however each inventive NiO x coating is plated through a steam-treatment technique, and the cutting tests are conducted under the following conditions:

Cutting condition; Dry cutting P30
Cutting speed; 25.5 m/min
Feed rate; 0.12 mm/rev
Works; made of S 50 c 180HB
Thickness; 18 mm through hole
Ion-plating process;
TiCN or TiAlN coating;
Inventive NiO x coating of TiCN or TiAlN+NiO x coating;
  (j) while introducing an Ni strike in a steam-treatment vessel, deposited with Ni O$_x$ on each TiCN and TiAlN coated works via a steam-treatment at a temperature of 550° C. for 30 minutes.

Figure 5:
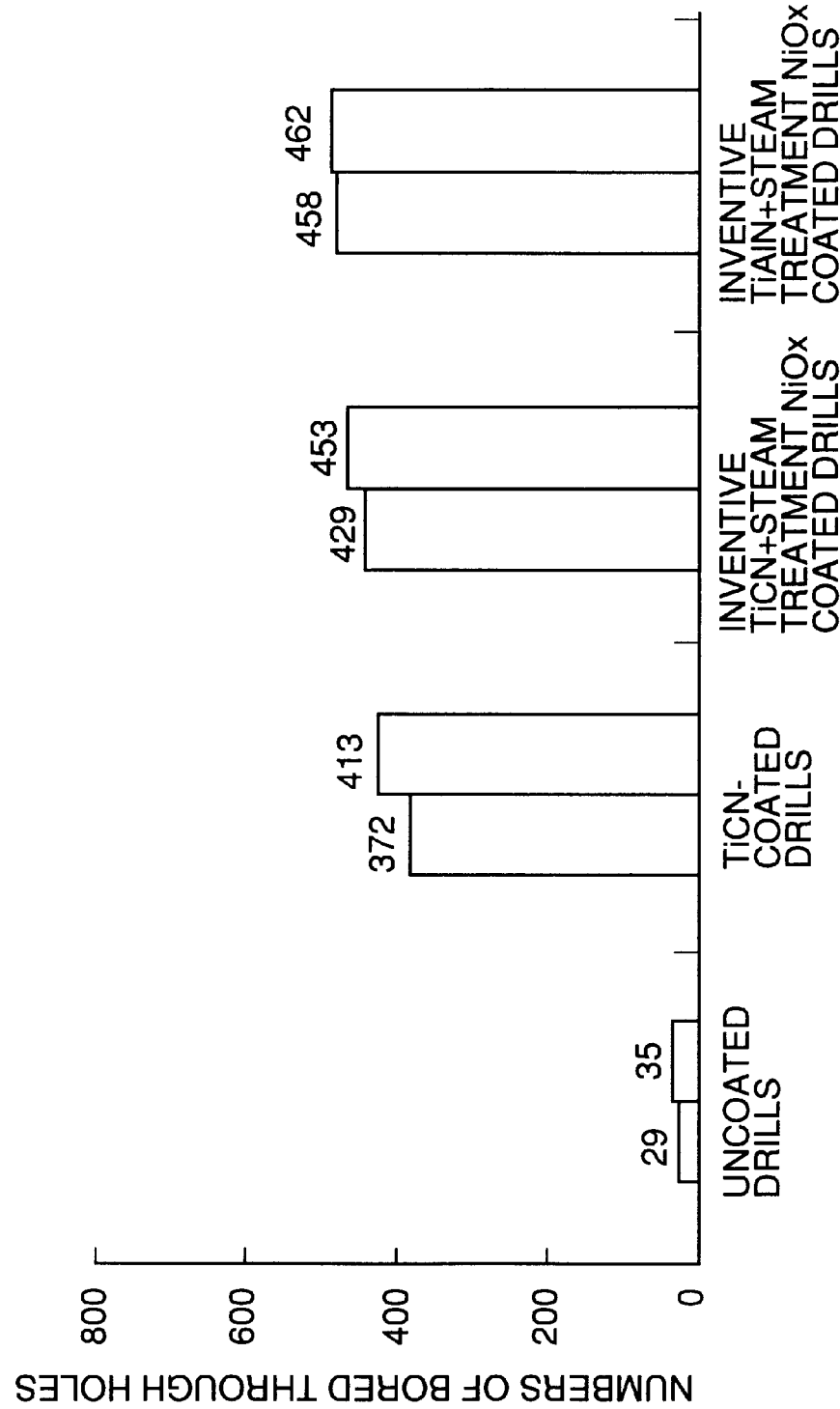
FIG. 5 is a graph illustrating the test results performed in the Example 3 wherein each two pieces of uncoated high speed tool steel SKH51 $\phi$ 6 mm drills, TiAlN coated SKH51 $\phi$ 6 mm drills, inventive TiCN+NiO$_x$ coated SKS51 $\phi$ 6 mm drills and inventive TiAlN+NiO$_x$ coated SKH51 $\phi$ 6 mm drills, are tested, each base TiCN and TiAlN coatings is deposited via the ion-plating technique, however each NiO$_x$ coating is deposited through a steam-treatment technique.

The test results are shown in FIG. 5. From the FIG. 5, it will be apparent that the numbers of through holes bored by the inventive NiO $_x$ coated drills exhibited far better service lives lengthened by over 12% than those of the conventional TiCN or TiAlN coated drills.

EXAMPLE 4

Figure 6A:
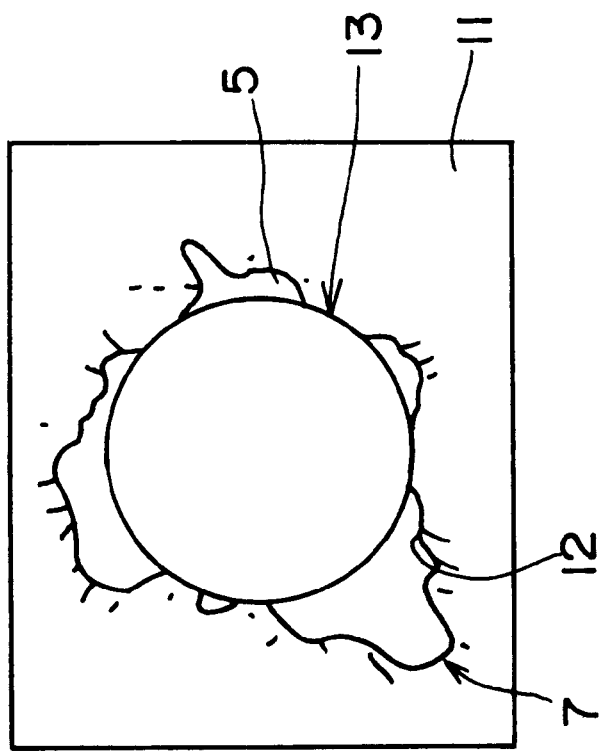
FIG. 6(a) is a view illustrating a judging criterion "Decision: A Good" judged from an indentation generated by an impression of an A-scale Rockwell hardness tester on the solid lubricant oxide film according to the present invention as being observed in an optical sight of a microscope of one hundred magnifications.

A forth comparative cutting tests by an A-scale Rockwell hardness tester performed on the upper solid lubricant oxide films illustrated in Table 1 conducted as an Example 4. Wherein each piece of coated high speed tool steel SKH51 φ 6 mm drills having a base or lower coated hard material film consisting of the ingredients illustrated in Table 1 and having a thickness ranging from 2.7 μm to 3.2 μm, and an upper solid lubricant oxide films of the thickness as shown in the Table 1. These drills are conducted cutting tests under the following conditions:

Cutting condition; Dry cutting
Cutting speed; 15.0 m/min
Feed rate; 0.12 mm/rev
Works; made of SNC 836 280HB
Thickness; 20 mm through hole The results of the A-scale Rockwell hardness tests shown in the Table 1 were judged according to the judging criterion exhibited in FIG. 6(a) "Decision: A Good" and FIG. 6(b) "Decision: B Bad". In FIG. 6(a) "Decision: A Good", no separation is observed both between the substrate 5 and the upper solid lubricant oxide film 1, or between the substrate 5 and the base or lower hard material film 2, in an area extending over 1 mm from the periphery of the indentation 3 generated by an impression of the A-scale Rockwell hardness tester (not shown) on the solid lubricant oxide film 1 as observed in an optical sight of a microscope of one hundred magnifications.

Figure 6B:
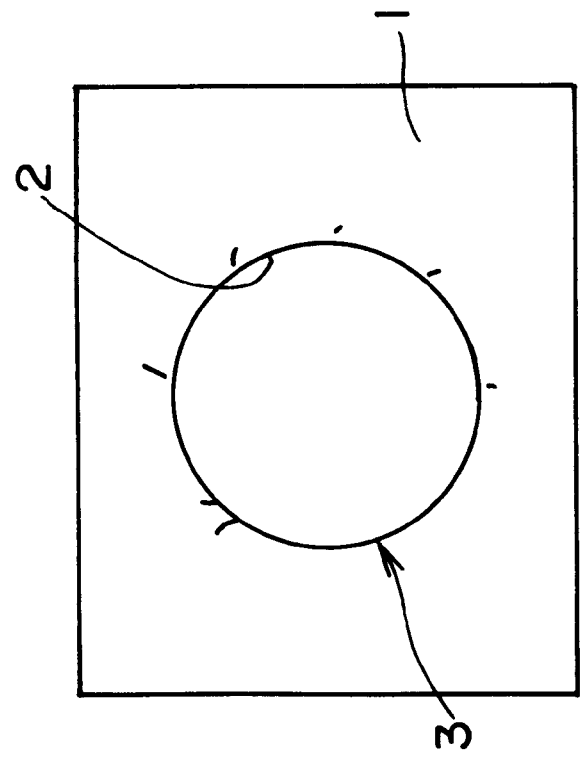
FIG. 6(b) is a view similar to FIG. 6(a) wherein there is shown that of a criterion "Decision: B Bad" judged from an indentation on the solid lubricant oxide film according to the conventional coating method.

Contrary to this, in FIG. 6(b) "Decision: B Bad", many separations 7 are observed between both, the substrate 5 and base or lower coating film 12 and the base coating film 12 and the upper lubricant oxide film 11. Also in the "Cutting test results" shown in the Table 1, each ○ shows a good effect showing that by more than 10% by number of bored through holes are gained, on the contrary, each ×shows a bad effect by less than 10% by number of those are gained, and cutting tests.

TABLE 1

| Base coated films | Upper lubricant films | Coating method: Ionplating | Coating method: Steam treat. | Thickness of upper lubricant films mm | Rockwell test results A: Good B: Bad | Cut test results | Inventive drills |
|---|---|---|---|---|---|---|---|
| 1 TiN | $NiO_x$ | ○ | | 2.5 | A | × | |
| 2 TiN | NiCrO | ○ | | 0.3 | A | ○ | ○ |
| 3 TiN | $ZrO_x$ | ○ | | 0.7 | B | × | |
| 4 TiN | $ZrO_x$ | ○ | | 0.5 | A | ○ | ○ |
| 5 TiAlN | $NiO_x$ | ○ | | 0.5 | A | ○ | ○ |
| 6 TiAlN | $ZrO_x$ | ○ | | 0.2 | A | ○ | ○ |
| 7 TiAlN | $CrO_x$ | ○ | | 2.2 | B | × | |
| 8 TiAlN | $SiO_x$ | ○ | | 0.6 | A | ○ | ○ |
| 9 TiAlN | $FeO_x$ | ○ | | 1.7 | A | ○ | ○ |
| 10 TiAlN | $CoO_x$ | ○ | | 0.5 | A | ○ | ○ |
| 11 TiAlN | $CrO_x$ | ○ | | 0.7 | A | ○ | ○ |
| 12 TiAlN | $FeO_x$ | ○ | | 0.1> | A | × | |
| 13 TiAlN | $CoO_x$ | ○ | | 2.5 | B | × | |
| 14 TiN | $NiO_x$ | | ○ | 2.0 | B | × | |
| 15 TiN | $CrO_x$ | | ○ | 0.8 | A | ○ | ○ |
| 16 TiAlN | $NiO_x$ | | ○ | 1.7 | A | ○ | ○ |
| 17 TiAlN | $NiO_x$ | | ○ | 4.0 | B | × | |

Figure 1:
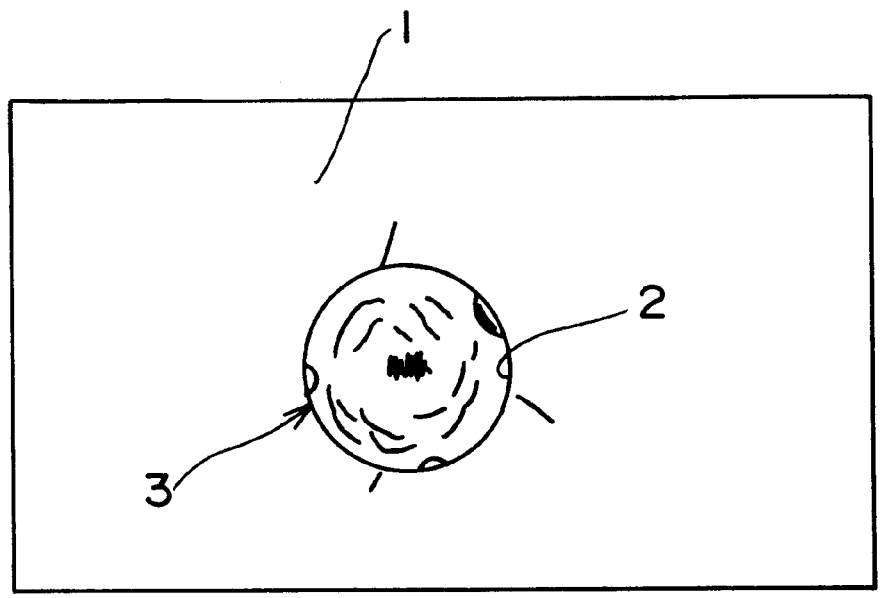
FIG. 1(a) is a view of an indentation generated by an impression of an A-scale Rockwell hardness tester on the solid lubricant oxide film according to the present invention as being observed in an optical sight of a microscope of one hundred magnifications.
FIG. 1(b) is a view similar to FIG. 1(a) wherein there is shown that of on the solid lubricant oxide film according to the conventional coating method.
Figure 1:
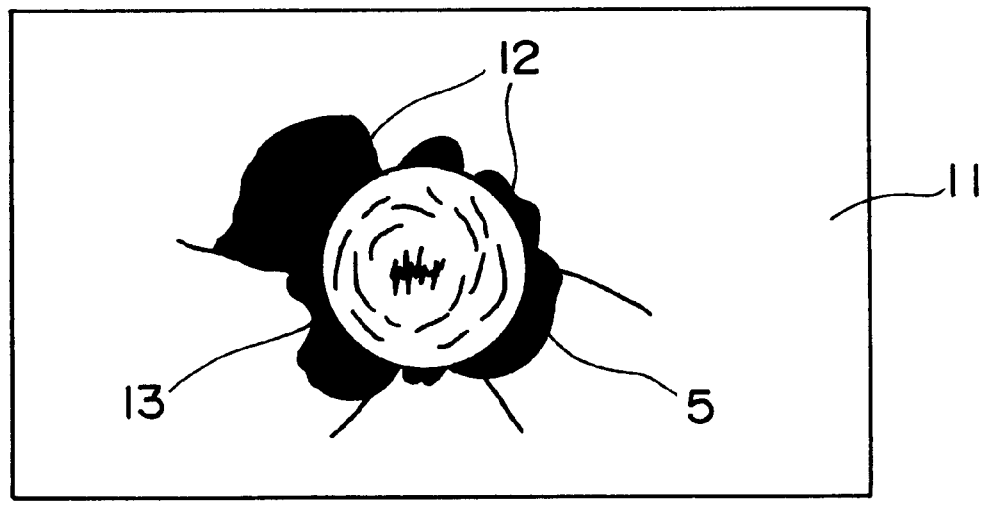
Figure 2:
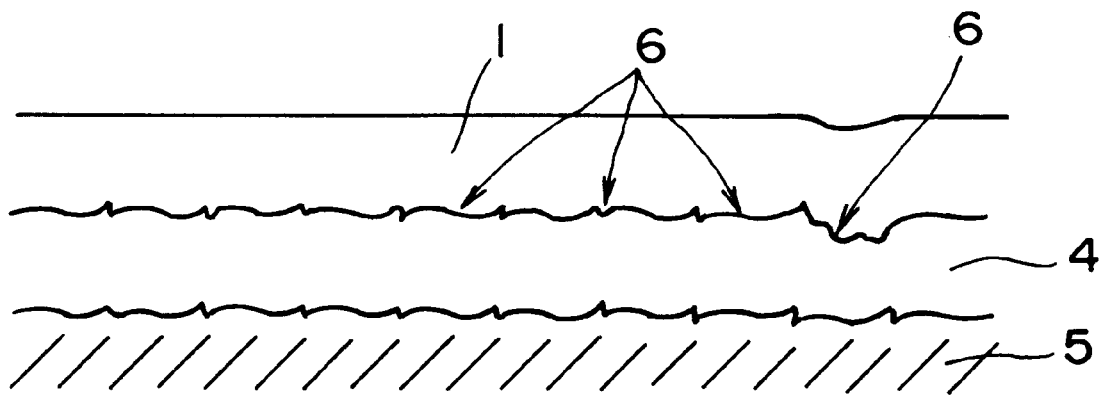
FIG. 2(a) illustrates an enlarged partial sectional view of a solid lubricant oxide film of the present invention in a state as been coated on a base hard material coating film of a coated cutting tool.
FIG. 2(b) is a view similar to FIG. 2(a) wherein there is shown that of the state after the cutting work of the coated cutting tool is finished.
Figure 2:
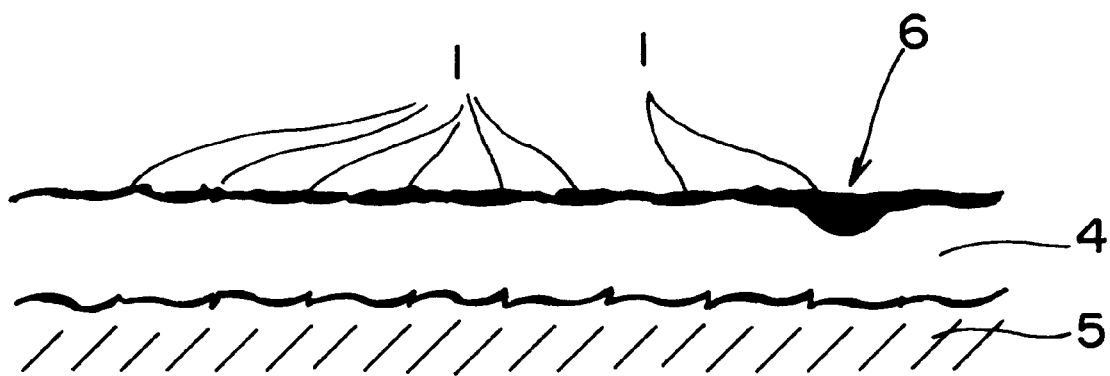

From FIGS. 2(a) and 2(b), the inventive lubricant oxide coating films deposited on the substrates each being coated with a hard material including any one of TiN, TiCN, or TiAlN, or combinations thereof, use oxides having lubricant properties which do not accord with the stoichiometrical theory, rather, effect good lubrication properties by keeping insufficiently processed portions thereof on a rough or defective porous surface of the base or lower hard material film or by keeping residual oxides of the solid lubricant oxide film thereon.

And further, the inventive coating process is characterized in that it may be applied under at a low temperature. This leads that the service lives of the inventive lubricant oxide coating films deposited on the substrates made of a tool steel, a high-speed steel, a cemented carbide, a cermet or a ceramic exhibit far better lengthened over from 12% to 25% than those of the conventional TiCN or TiAlN coated drills without degrading the sharpness of the coated cutting tool.

Also, it will be expected that the inventive coating process deposited directly on the substrates made of a tool steel, a high-speed steel, a cemented carbide, a cermet or a ceramic may perform the same effect as those of on the hard metal coated cutting tool of this invention. Additionally, since the inventive coating process uses a physical or chemical deposition technique widely applicable in many mass-productional industrial fields, contributes to widely lengthen the service life of mass-produced cutting tools.

What is claimed is:

1. A method for manufacturing a solid lubricant film for a coated cutting tool including a drill, an end mill or a tap, having a substrate made of a tool steel, a high-speed steel, a cemented carbide, a cermet or a ceramic and being coated with a hard material including any one of TiN, TiCN, TiAlN, or combinations thereof comprising:

depositing on the coated cutting tool a solid lubricant oxide film ($MO_x$, $0.2 \leq x < 2$) including oxygen as a main ingredient, with M being a metal consisting of any one of Si, Zr, Ni, Fe, Co, Cr or combinations thereof, wherein the solid lubricant oxide film has a thickness (t), where: $0.01 \mu m \leq t < 2.0 \mu m$, and said depositing comprises the steps of:

heating a vacuum ion-plating chamber from room temperature to a temperature between from 150° C. to 450° C. and depositing the solid lubricant oxide film by ion-plating by one of (1) applying a negative bias voltage charge of a direct current of from −15 V to −1000 V and (2) applying a high frequency alternating current having an effective negative bias voltage charge equivalent to those of the direct current of from −15 V to −1000 V.

2. The method for manufacturing the solid lubricant film for the coated cutting tool as claimed in claim 1, wherein in an indentation generated by an impression of an A-scale Rockwell hardness tester on the solid lubricant oxide film, no peeling or no cracking both between the substrate and the solid lubricant oxide film, or between the substrate and the hard material film, in an area extending over 1 mm from the periphery of the indentation is observed in an optical sight of a microscope of one hundred magnifications.

3. A method for manufacturing a solid lubricant film for a coated cutting tool including a drill, an end mill or a tap, having a substrate made of a tool steel, a high-speed steel, a cemented carbide, a cermet or a ceramic and being coated with a hard material including any one of TiN, TiCN, TiAlN, or combinations thereof comprising:

depositing on the coated cutting tool a solid lubricant oxide film ($MO_x$, $0.2 \leq x < 2$) including oxygen as a main ingredient, with M being a metal consisting of Ni or Cr or combinations thereof, wherein said depositing comprises coating the solid lubricant oxide film on the coated cutting tool as an oxide of Ni or Cr oxidized via a wet plating technique including a thermal oxidization, an anode oxidization or steam-treatment technique, wherein the solid lubricant oxide film has a thickness (t) in a range: $0.01 \mu m < t \leq 3.0 \mu m$.

4. The method for manufacturing the solid lubricant for the coated cutting tool as claimed in claim 3, wherein in an indentation generated by an impression of an A-scale Rockwell hardness tester on the solid lubricant oxide film, no peeling or no cracking both between the substrate and the solid lubricant oxide film, or between the substrate and the hard material film, in an area extending over 1 mm from the periphery of the indentation is observed in an optical sight of a microscope of one hundred magnifications.

* * * * *